US012167567B2

(12) United States Patent
Chia et al.

(10) Patent No.: US 12,167,567 B2
(45) Date of Patent: Dec. 10, 2024

(54) FAN SILENCER MODULE

(71) Applicant: Cisco Technology, Inc., San Jose, CA (US)

(72) Inventors: Vic Hong Chia, Sunnyvale, CA (US); Yongguo Chen, Shanghai (CN); Yaotsan Tsai, San Jose, CA (US); Hua Yang, Tracy, CA (US); Xin Mao, Milpitas, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 17/498,164

(22) Filed: Oct. 11, 2021

(65) Prior Publication Data

US 2022/0312636 A1 Sep. 29, 2022

Related U.S. Application Data

(60) Provisional application No. 63/165,264, filed on Mar. 24, 2021.

(51) Int. Cl.
*H05K 7/20* (2006.01)
*F04D 29/66* (2006.01)
(Continued)

(52) U.S. Cl.
CPC ....... *H05K 7/20172* (2013.01); *F04D 29/664* (2013.01); *G10K 11/16* (2013.01); *H05K 7/20145* (2013.01); *H05K 9/0015* (2013.01)

(58) Field of Classification Search
CPC .......... H05K 7/20172; H05K 7/20145; H05K 9/0015; H05K 9/0041; F04D 29/664; F04D 25/0613; G10K 11/16; G10K 11/161
See application file for complete search history.

(56) References Cited

U.S. PATENT DOCUMENTS

| | | | |
|---|---|---|---|
| 6,185,097 B1 | 2/2001 | Behl | |
| 6,426,459 B1* | 7/2002 | Mitchell | H05K 9/0041 174/382 |
| 6,610,922 B1 | 8/2003 | Twiss et al. | |
| 6,817,940 B2* | 11/2004 | Pfannenberg | H05K 7/20181 361/695 |
| 7,515,413 B1* | 4/2009 | Curtis | H05K 7/20172 415/213.1 |

(Continued)

FOREIGN PATENT DOCUMENTS

| | | | | |
|---|---|---|---|---|
| CN | 210531248 U | * | 5/2020 | |
| CN | 111396368 A | | 7/2020 | |
| WO | WO-03053116 A1 | * | 6/2003 | .......... H05K 7/1424 |

OTHER PUBLICATIONS

Holland Shielding Systems BV, "Honeycomb fan shield," https://hollandshielding.com/Honeycomb-fan-shield, Mar. 2021, 2 pages.
(Continued)

*Primary Examiner* — Woody A Lee, Jr.
*Assistant Examiner* — Eric A Lange
(74) *Attorney, Agent, or Firm* — Edell, Shapiro & Finnan, LLC

(57) ABSTRACT

A fan silencer module includes a housing having a first end of the housing, a second end of the housing, and an interior surface between the first end of the housing and the second end of the housing. Acoustic absorbing material is disposed on the interior surface. A honeycomb air flow director is disposed at the second end of the housing. And an electromagnetic interference gasket surrounds an outer edge of the honeycomb air flow director. In an embodiment, a depth of the electromagnetic interference gasket is at least as deep as a depth of the honeycomb air flow director. Also provided is a handle, and a latch actuator, to enable removal and replacement of the fan silencer module and an associated fan module from a chassis.

20 Claims, 5 Drawing Sheets

(51) Int. Cl.
*G10K 11/16* (2006.01)
*H05K 9/00* (2006.01)

(56) References Cited

U.S. PATENT DOCUMENTS

| | | | | |
|---|---|---|---|---|
| 7,558,061 | B2* | 7/2009 | Franz | F04D 29/646 |
| | | | | 415/213.1 |
| 7,715,413 | B2 | 5/2010 | Vaziri et al. | |
| 10,240,615 | B1* | 3/2019 | Kho | F04D 29/664 |
| 2007/0242431 | A1* | 10/2007 | Kuo | H01L 23/467 |
| | | | | 257/E23.099 |
| 2009/0231804 | A1 | 9/2009 | Franz et al. | |
| 2010/0172740 | A1* | 7/2010 | Fan | F16F 1/3732 |
| | | | | 415/119 |
| 2019/0093674 | A1 | 3/2019 | Kho et al. | |
| 2021/0062828 | A1* | 3/2021 | Hong | F04D 29/646 |
| 2021/0262489 | A1* | 8/2021 | Huang | F04D 29/522 |

OTHER PUBLICATIONS

Arista, "7020 Series 1RU (Gen 3)," Quick Start Guide, https://www.arista.com/zh/support/advisories-notices/end-of-sale/94-support/quick-start-guide/qsg-7020-series-1ru-gen3, retrieved on Oct. 11, 2021, 28 pages.

Risinghippo, "Sponge Neoprene W/Adhesive 54in Wide X 1/2in Thick X 3Ft Long," Product Details, https://risinghippo.com/products/sponge-neoprene-w-adhesive-36in-wide-x-1-2in-thick-x-54in-long?variant=39329535361079&gclid=EAlaIQobChMl4MCfssfC8wlVC5yzCh1BWQ-eEAQYBiABEgKdZfD_BwE, retrieved on Oct. 11, 2021, 3 pages.

Corn Electronics, "8PCs Silicone Rubber Cooling Fan Mounts Anti-Vibration Anti Noise Rubber Rivets Pin PC case," https://www.newegg.com/p/1YF-009W-00041?item=9SIA4RE7EK4439&source=region&nm_mc=knc-googlemkp-pc&cm_mmc=knc-googlemkp-pc-_-pla-corn+electronics-_-case+fans-_-9SIA4RE7EK4439&gclid=EAlaIQobChMl2dnX5MfC8wlVsdSzCh2bSAg1EAQYAyABEgLlRvD_BwE&gclsrc=aw.ds, retrieved on Oct. 11, 2021, 3 pages.

Nvidia, "FRU Replacements," QM8700, QM8790 1U HDR 200Gb/s InfiniBand Switch Systems User Manual, https://docs.mellanox.com/display/QM87XX/FRU%20Replacements, retrieved on Oct. 11, 2021, 6 pages.

Infoblox, "Infoblox Installation Guide Network Automation 2200 Appliance," https://docs.infoblox.com/download/attachments/8945703/Infoblox%20Installation%20Guide%20Network%20Automation%202200%20Appliance.pdf?version=1&modificationDate=1540919728255&api=v2, retrieved on Oct. 11, 2021, 21 pages.

* cited by examiner

FAN SILENCER MODULE

CROSS-REFERENCE TO RELATED APPLICATION

This application claims the benefit U.S. Provisional Application No. 63/165,264, filed Mar. 24, 2021, the subject matter of which is incorporated herein by reference in its entirety.

TECHNICAL FIELD

The present disclosure relates to a fan silencer module that attaches to a fan module. The combined assembly of the fan silencer module and fan module may be used, e.g., to cool a rack mounted computing device.

BACKGROUND

Most network and computing gear still relies heavily on forced air cooling. A balance must be struck among power, acoustic noise, and airflow to achieve optimum cooling. To achieve higher volume of air (e.g., a greater value of cubic feet per minute (CFM)), more power may be allocated to a fan to increase its speed, but a higher fan speed typically results in undesirable higher acoustic noise.

As equipment is developed for higher processing speeds to handle, e.g., Fifth Generation (5G) mobility technology, computing device cooling continues to be a challenge. For example, with 5G technology, data transmission speeds are increased compared to prior communications technologies. While the speed and bandwidth increase is often attained using fiber optic cable that itself does not generate excessive heat, front end optical receivers, which are used to convert optical signals to electrical signals, still have to dissipate a considerable amount of heat. Ultimately, all heatsink solutions rely on some form of forced air to carry the heat away from heat generating sources, including computing devices and optical receivers, among other equipment and components.

DESCRIPTION OF EXAMPLE EMBODIMENTS

Overview

Figure 1:
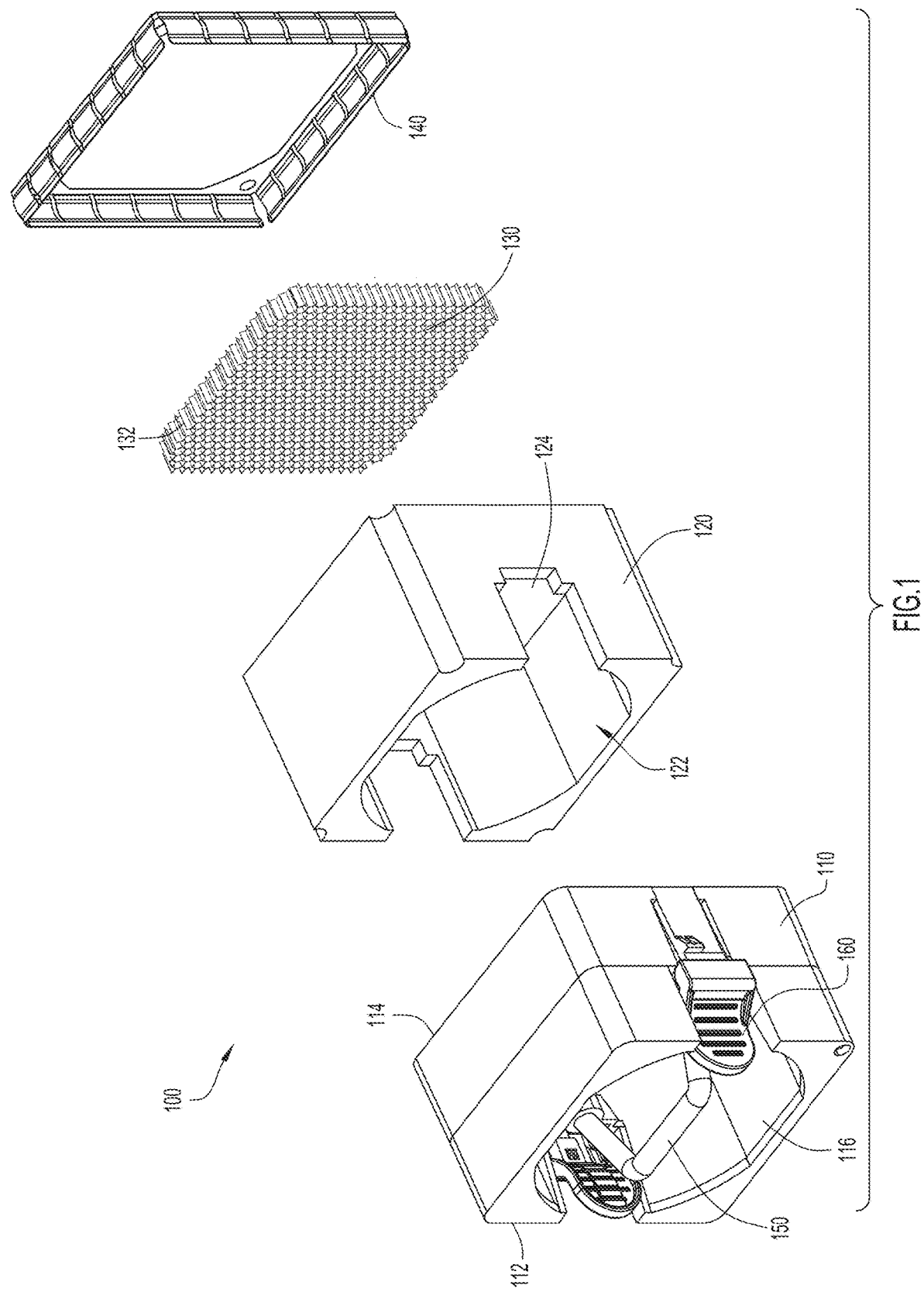
FIG. 1 is an exploded view of a fan silencer module, according to an example embodiment.

Presented herein is fan silencer module that includes a housing having a first end of the housing, a second end of the housing, and an interior surface between the first end of the housing and the second end of the housing. Acoustic absorbing material is disposed on the interior surface. A honeycomb air flow director is disposed at the second end of the housing. And, an electromagnetic interference gasket surrounds an outer edge of the honeycomb air flow director. In an embodiment, a depth of the electromagnetic interference gasket is at least as deep as a depth of the honeycomb air flow director. Also provided is a handle, and a latch actuator, to enable removal and replacement of the fan silencer module and an associated fan module from a chassis.

In another embodiment, the fan silencer module includes a housing having a first end of the housing, a second end of the housing, and an interior surface of the housing between the first end of the housing and the second end of the housing, acoustic absorbing material disposed on the interior surface of the housing, a honeycomb air flow director disposed at the second end of the housing, an electromagnetic interference gasket surrounding an outer edge of the honeycomb air flow director, and a latch configured to engage with a chassis. In an implementation, the acoustic absorbing material disposed on the interior surface includes a cutout to accommodate the latch.

In still another embodiment, a method is provided. The method includes disposing acoustic absorbing material on an interior surface of a housing of a fan silencer module, attaching a honeycomb air flow director to one end of the housing of the fan silencer module, and attaching an electromagnetic interference gasket that surrounds an outer edge of the honeycomb air flow director, wherein a depth of the electromagnetic interference gasket is at least as deep as a depth of the honeycomb air flow director.

EXAMPLE EMBODIMENTS

To achieve higher fan performance fan, more power may be applied to obtain higher revolutions per minute (RPM) of the fan. The embodiments disclosed herein achieve higher RPM, but without a corresponding expected increase in overall acoustic noise.

In one embodiment, a fan silencer module is provided and includes a housing, an integrated handle, a latch actuator, honeycomb air flow director, and acoustic noise absorber material disposed on the interior surface of the housing. The fan silencer module is affixed to a fan module and the resulting combined assembly may be slid into a chassis to cool the components, printed circuit boards, etc., mounted therein.

As shown in the figures, described in detail below, a honeycomb air flow director, surrounded by an EMI gasket, is disposed at an exit of a fan module, followed by a tunnel of, e.g., acoustic noise absorber material (e.g., foam) inside a housing of the fan silencer module. The housing includes an integrated handle and latch actuator. The honeycomb air flow director, acoustic foam, and integrated handle with latch actuator may be configured as a single, discrete, module which can be affixed to a similarly-sized fan module.

In an embodiment, the housing extends to a distal end of a handle and latch actuators.

The honeycomb air flow director provides maximized open ratio and is helpful to straighten and smooth air flow.

The acoustic noise absorber material absorbs noise and provides improved acoustic quality. As such, a fan can operate at higher speed but still meet Network Equipment-Building System (NEBS) requirements.

Reference is now made to FIG. 1, which is an exploded view of a fan silencer module 100, according to an example embodiment. Fan silencer module 100 includes a housing 110 (made from, e.g., plastic or metal) having a first end 112, a second end 114, and an interior surface 116 extending between the first end 112 of the housing 110 and the second end 114 of the housing 110. Acoustic absorbing material 120 (e.g., foam, rubber, etc.) is disposed on the interior surface 116. The acoustic foam defines an air tunnel 122 through which air is forced by a fan of a fan module 200 (shown in FIG. 2 and FIG. 3). A honeycomb air flow director 130 is disposed at the second end 114 of the housing 110, and is used to uniformly straighten airflow with air tunnel 122. An electromagnetic interference (EMI) gasket 140 surrounds an outer edge 132 of honeycomb air flow director 130. In one embodiment, a depth of the electromagnetic interference gasket 140 is at least as deep as a depth of the honeycomb air flow director 130.

Figure 3:
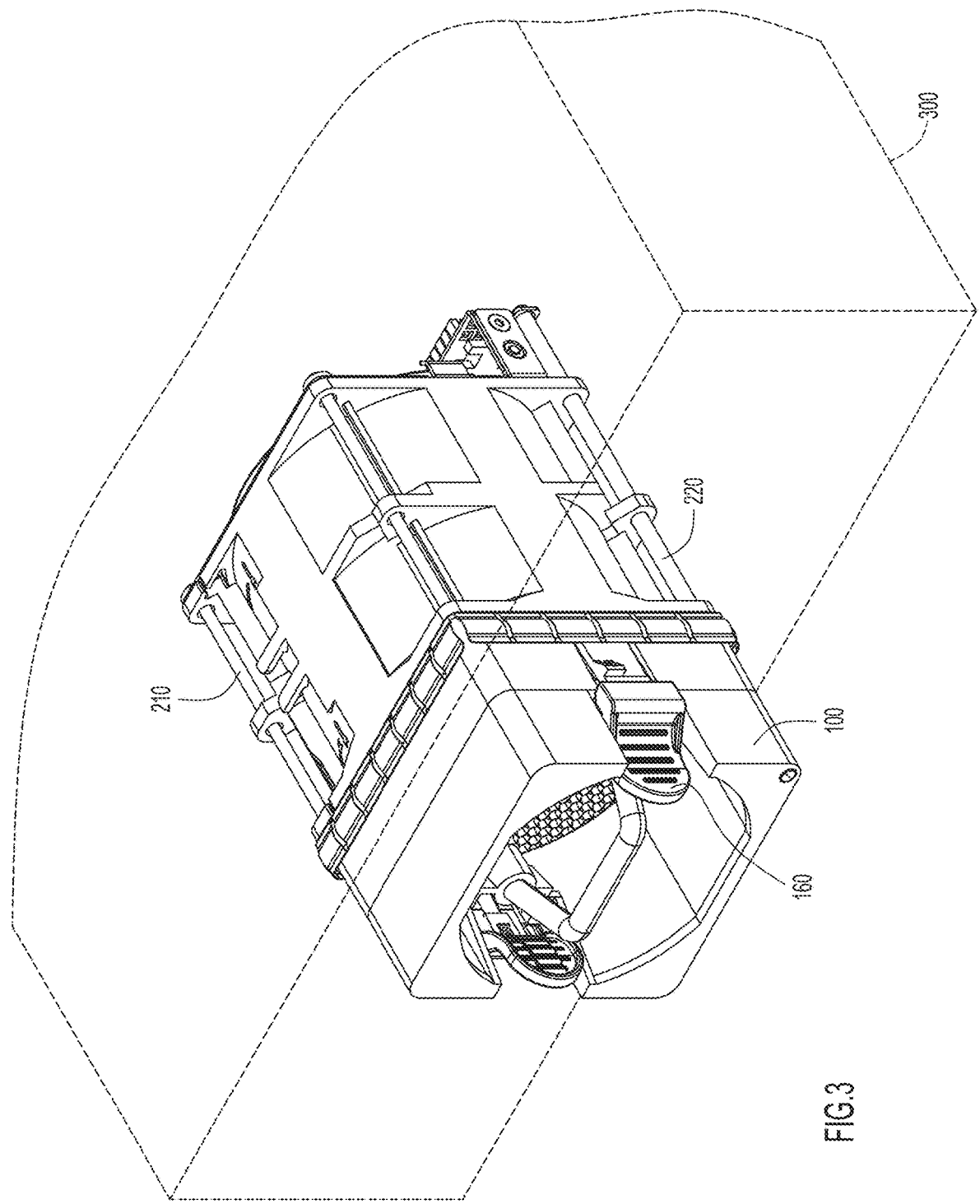
FIG. 3 shows a combined fan silencer module and fan module mounted in a chassis, according to an example embodiment.

Also shown in FIG. 1 is a handle 150, and a latch actuator 160 (or simply "latch"), to enable removal and replacement of the fan silencer module 100 and associated fan module 200 from a chassis 300 (FIG. 3).

Figure 2:
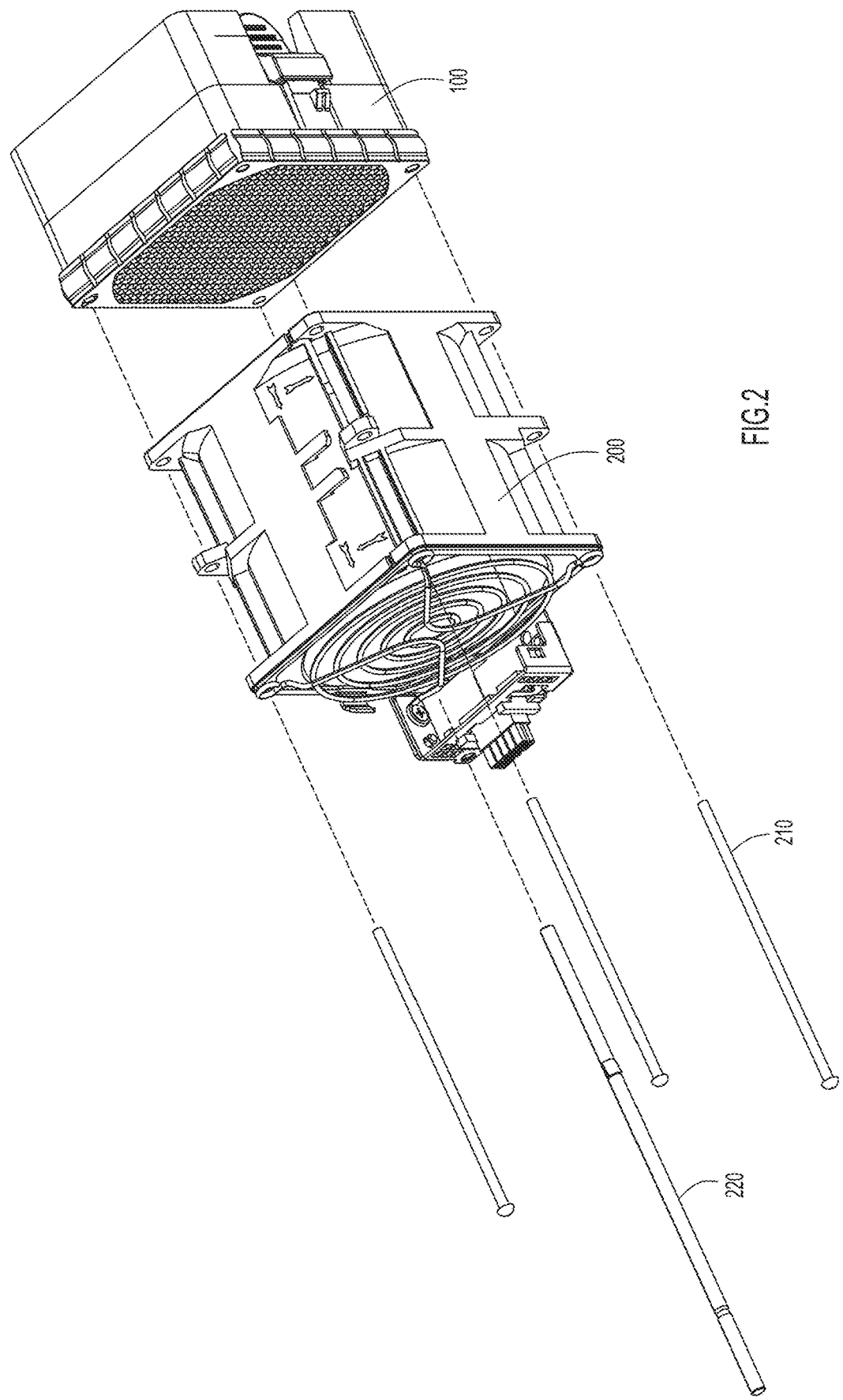
FIG. 2 shows an assembly view of the fan silencer module and a fan module, according to an example embodiment.

FIG. 2 shows an assembly view of the fan silencer module 100 and a fan module 200, according to an example embodiment. As shown, fan silencer module 100 and fan module 200 may be joined via one more screws or bolts 210. A light pipe 220, may also pass through an opening in fan module 200 and fan silencer module 100 to provide a visual indication of operation to a user or operator.

FIG. 3 shows a combined fan silencer module 100 and fan module 200 mounted in a chassis 300, according to an example embodiment. In this figure, those skilled in the art will appreciate that latch actuator 160 (one on each side of fan silencer module 100 in the depicted embodiment) engages with corresponding protrusion (not shown) on chassis 300 to lock in place the combined fan silencer module 100 and fan module 200 in opening of the chassis 300.

Several features are of note in the depictions of fan silencer module 100 in FIGS. 1-3. For example, the acoustic absorbing material 120 extends, on the interior surface 116 of housing 110, between the first end 112 of the housing and the second end 114 of the housing. The acoustic absorbing material 120 includes a cutout 124 to accommodate the operation of latch actuator 160.

Also, in an effort to elongate air tunnel 122 and thus better control excess acoustic noise, first end 112 of housing 110 extends to a distal end of latch actuator 160. That is, an imaginary plane that abuts first end 112 of housing 110 and is perpendicular to a longitudinal axis of air tunnel 122, may pass through or at least touch a distal end of latch actuator 160.

Similarly, first end 112 of housing 110 extends to a distal end of the handle 150. That is, the imaginary plane that abuts first end 112 of housing 110 and is perpendicular to the longitudinal axis of air tunnel 122, may pass through or at least touch a distal end of handle 150.

Further, in some implementations, acoustic noise absorber materials may also be applied to an exterior surface of housing 110.

With the elongated air tunnel 122 that extends all the way back to the distal ends of the latch actuator 160 and handle 150, better noise suppression is achieved. With better noise suppression, it is possible to increase power to the fan module 200, and thus increase the CFM parameter, thus increasing overall cooling of chassis 300, and any rack in which chassis 300 may be mounted.

It is noted that some noise suppression techniques use acoustic absorbing materials (e.g., foam) inside chassis 300. The approach described herein, in contrast, incorporates acoustic absorbing material 120 in air tunnel 122 inside housing 110 of fan silencer module 100.

As those skilled in the art will appreciate, the embodiments described herein provide a high airflow fan silencer module 100 to achieve optimum fan performance, namely, relative high fan RPM and relatively low corresponding acoustic noise. Fan silencer module 100 may be configured to operate alongside fan modules of any size, including, e.g., 40 mm, 80 mm, 120 mm, etc. The modular configuration of fan silencer module 100 also makes it easy to install and remove.

Figure 4:
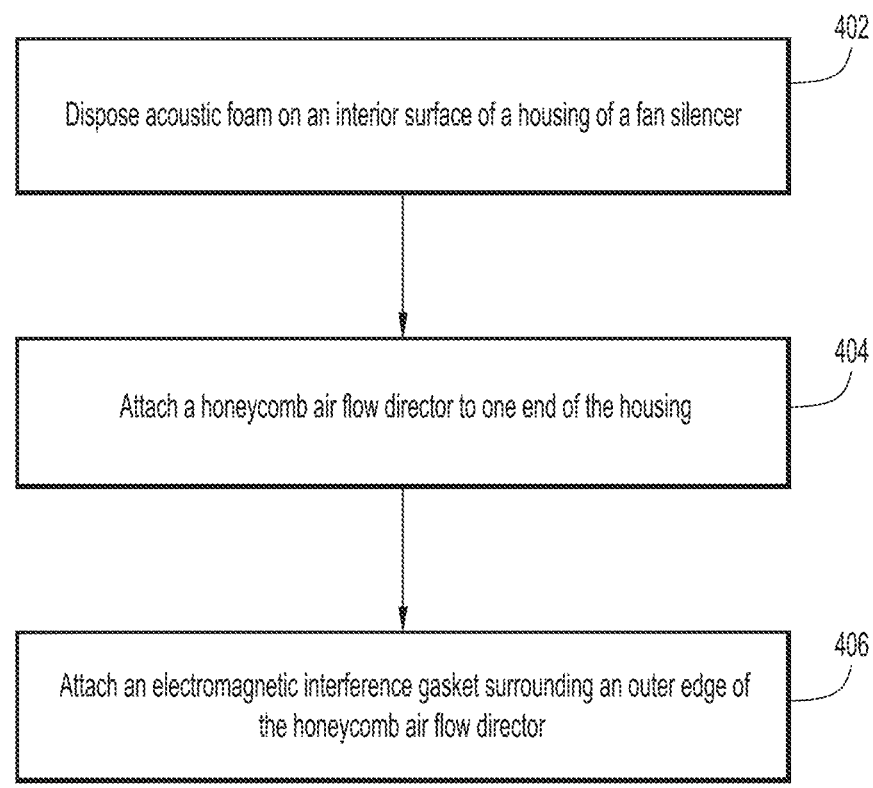
FIG. 4 is a flowchart showing a series of operations for assembling a fan silencer module, according to an example embodiment.

FIG. 4 is a flowchart showing a series of operations for assembling a fan silencer module, according to an example embodiment. At 402, acoustic absorbing material is disposed on an interior surface of a housing of a fan silencer. At 404, a honeycomb air flow director is attached to one end of the housing, and, at 406, an electromagnetic interference gasket that surrounds the honeycomb air flow director is further attached.

Figure 5:
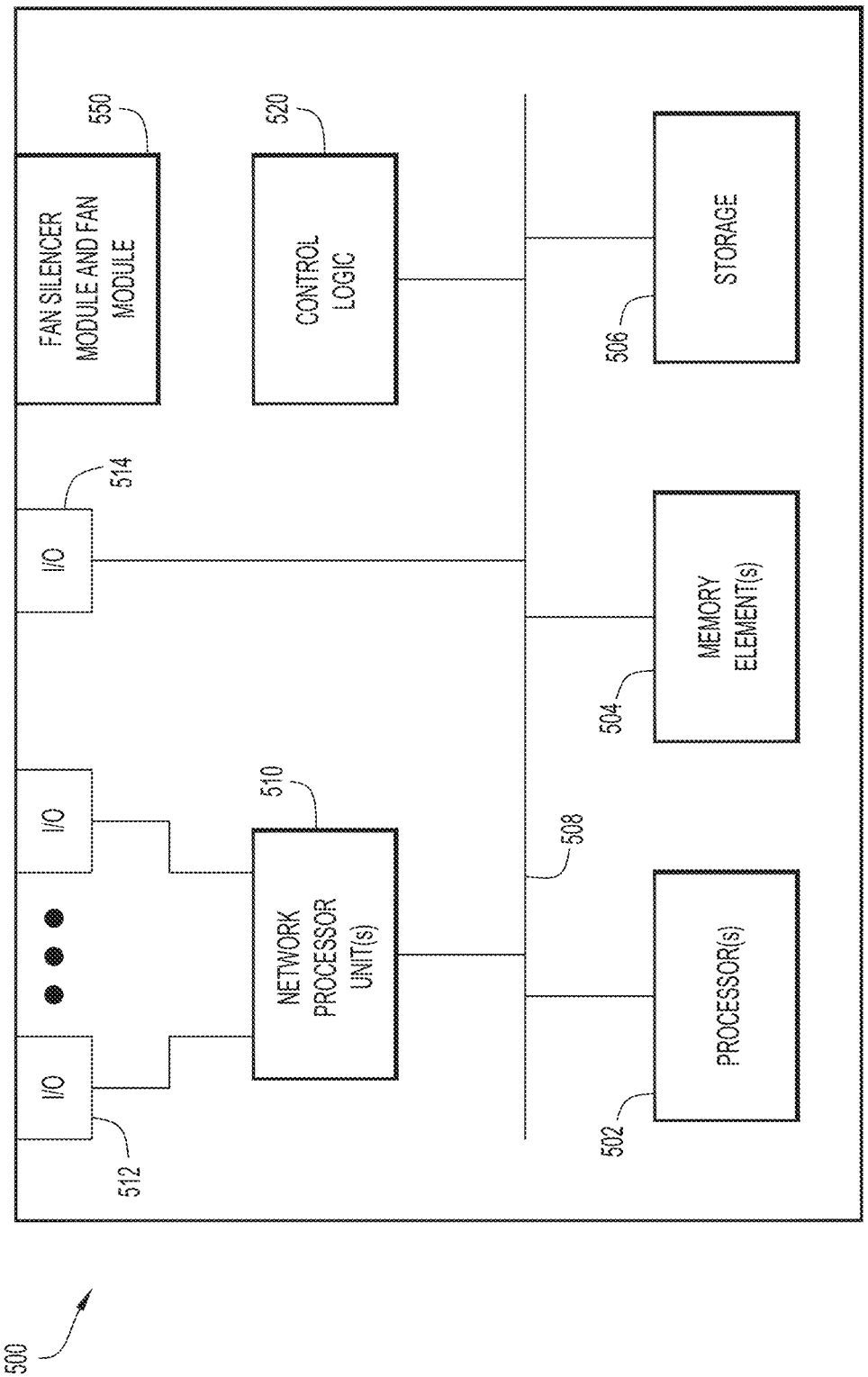
FIG. 5 illustrates a hardware block diagram of a computing device that may make use of the fan silencer module in combination with a fan module, according to an example embodiment.

FIG. 5 illustrates a hardware block diagram of a computing device that may make use of the fan silencer module in combination with a fan module, according to an example embodiment. In at least one embodiment, the computing device 500 may include one or more processor(s) 502, one or more memory element(s) 504, storage 506, a bus 508, one or more network processor unit(s) 510 interconnected with one or more network input/output (I/O) interface(s) 512, one or more I/O interface(s) 514, and control logic 520. In various embodiments, instructions associated with logic for computing device 500 can overlap in any manner and are not limited to the specific allocation of instructions and/or operations described herein. Also provided is a combined fan silencer module and fan module 550 that provides cooling for computing device 500. Combined fan silencer module and fan module 550 may include the fan silencer module 100 described above in combination with fan module 200.

In at least one embodiment, processor(s) 502 is/are at least one hardware processor configured to execute various tasks, operations and/or functions for computing device 500 as described herein according to software and/or instructions configured for computing device 500. Processor(s) 502 (e.g., a hardware processor) can execute any type of instructions associated with data to achieve the operations detailed herein. In one example, processor(s) 502 can transform an element or an article (e.g., data, information) from one state or thing to another state or thing. Any of potential processing elements, microprocessors, digital signal processor, baseband signal processor, modem, PHY, controllers, systems, managers, logic, and/or machines described herein can be construed as being encompassed within the broad term 'processor'.

In at least one embodiment, memory element(s) 504 and/or storage 506 is/are configured to store data, information, software, and/or instructions associated with computing device 500, and/or logic configured for memory element(s) 504 and/or storage 506. For example, any logic can, in various embodiments, be stored for computing device 500 using any combination of memory element(s) 504 and/or storage 506. Note that in some embodiments, storage 506 can be consolidated with memory element(s) 504 (or vice versa), or can overlap/exist in any other suitable manner.

In at least one embodiment, bus 508 can be configured as an interface that enables one or more elements of computing device 500 to communicate in order to exchange information and/or data. Bus 508 can be implemented with any architecture designed for passing control, data and/or information between processors, memory elements/storage, peripheral devices, and/or any other hardware and/or software components that may be configured for computing device 500. In at least one embodiment, bus 508 may be implemented as a fast kernel-hosted interconnect, potentially using shared memory between processes (e.g., logic), which can enable efficient communication paths between the processes.

In various embodiments, network processor unit(s) 510 may enable communication between computing device 500 and other systems, entities, etc., via network I/O interface(s) 512 to facilitate operations discussed for various embodiments described herein. In various embodiments, network processor unit(s) 510 can be configured as a combination of hardware and/or software, such as one or more Ethernet driver(s) and/or controller(s) or interface cards, Fibre Channel (e.g., optical) driver(s) and/or controller(s), and/or other similar network interface driver(s) and/or controller(s) now known or hereafter developed to enable communications between computing device 500 and other systems, entities, etc. to facilitate operations for various embodiments described herein. In various embodiments, network I/O interface(s) 512 can be configured as one or more Ethernet port(s), Fibre Channel ports, and/or any other I/O port(s) now known or hereafter developed. Thus, the network processor unit(s) 510 and/or network I/O interface(s) 512 may include suitable interfaces for receiving, transmitting, and/or otherwise communicating data and/or information in a network environment.

I/O interface(s) 514 allow for input and output of data and/or information with other entities that may be connected to computing device 500. For example, I/O interface(s) 514 may provide a connection to external devices such as a keyboard, keypad, a touch screen, and/or any other suitable input and/or output device now known or hereafter developed. In some instances, external devices can also include portable computer readable (non-transitory) storage media such as database systems, thumb drives, portable optical or magnetic disks, and memory cards. In still some instances, external devices can be a mechanism to display data to a user, such as, for example, a computer monitor, a display screen, or the like.

In various embodiments, control logic 520 can include instructions that, when executed, cause processor(s) 502 to perform operations, which can include, but not be limited to, providing overall control operations of computing device; interacting with other entities, systems, etc. described herein; maintaining and/or interacting with stored data, information, parameters, etc. (e.g., memory element(s), storage, data structures, databases, tables, etc.); combinations thereof; and/or the like to facilitate various operations for embodiments described herein.

Programs may be identified based upon application(s) for which they are implemented in a specific embodiment. However, it should be appreciated that any particular program nomenclature herein is used merely for convenience; thus, embodiments herein should not be limited to use(s) solely described in any specific application(s) identified and/or implied by such nomenclature.

In various embodiments, entities as described herein may store data/information in any suitable volatile and/or non-volatile memory item (e.g., magnetic hard disk drive, solid state hard drive, semiconductor storage device, random access memory (RAM), read only memory (ROM), erasable programmable read only memory (EPROM), application specific integrated circuit (ASIC), etc.), software, logic (fixed logic, hardware logic, programmable logic, analog logic, digital logic), hardware, and/or in any other suitable component, device, element, and/or object as may be appropriate. Any of the memory items discussed herein should be construed as being encompassed within the broad term 'memory element'. Data/information being tracked and/or sent to one or more entities as discussed herein could be provided in any database, table, register, list, cache, storage, and/or storage structure: all of which can be referenced at any suitable timeframe. Any such storage options may also be included within the broad term 'memory element' as used herein.

Note that in certain example implementations, operations as set forth herein may be implemented by logic encoded in one or more tangible media that is capable of storing instructions and/or digital information and may be inclusive of non-transitory tangible media and/or non-transitory computer readable storage media (e.g., embedded logic provided in: an ASIC, digital signal processing (DSP) instructions, software (potentially inclusive of object code and source code), etc.) for execution by one or more processor(s), and/or other similar machine, etc. Generally, memory element(s) 504 and/or storage 506 can store data, software, code, instructions (e.g., processor instructions), logic, parameters, combinations thereof, and/or the like used for operations described herein. This includes memory element(s) 504 and/or storage 506 being able to store data, software, code, instructions (e.g., processor instructions), logic, parameters, combinations thereof, or the like that are executed to carry out operations in accordance with teachings of the present disclosure.

In some instances, software of the present embodiments may be available via a non-transitory computer useable medium (e.g., magnetic or optical mediums, magneto-optic mediums, CD-ROM, DVD, memory devices, etc.) of a stationary or portable program product apparatus, downloadable file(s), file wrapper(s), object(s), package(s), container(s), and/or the like. In some instances, non-transitory computer readable storage media may also be removable. For example, a removable hard drive may be used for memory/storage in some implementations. Other examples may include optical and magnetic disks, thumb drives, and smart cards that can be inserted and/or otherwise connected to a computing device for transfer onto another computer readable storage medium.

Variations and Implementations

Embodiments described herein may include one or more networks, which can represent a series of points and/or network elements of interconnected communication paths for receiving and/or transmitting messages (e.g., packets of information) that propagate through the one or more networks. These network elements offer communicative interfaces that facilitate communications between the network elements. A network can include any number of hardware and/or software elements coupled to (and in communication with) each other through a communication medium. Such networks can include, but are not limited to, any local area network (LAN), virtual LAN (VLAN), wide area network (WAN) (e.g., the Internet), software defined WAN (SD-WAN), wireless local area (WLA) access network, wireless wide area (WWA) access network, metropolitan area network (MAN), Intranet, Extranet, virtual private network (VPN), Low Power Network (LPN), Low Power Wide Area Network (LPWAN), Machine to Machine (M2M) network, Internet of Things (IoT) network, Ethernet network/switching system, any other appropriate architecture and/or system that facilitates communications in a network environment, and/or any suitable combination thereof.

Networks through which communications propagate can use any suitable technologies for communications including wireless communications (e.g., 4G/5G/nG, IEEE 802.11 (e.g., Wi-Fi®/Wi-Fi6®), IEEE 802.16 (e.g., Worldwide Interoperability for Microwave Access (WiMAX)), Radio-Frequency Identification (RFID), Near Field Communication (NFC), Bluetooth™, mm.wave, Ultra-Wideband (UWB), etc.), and/or wired communications (e.g., T1 lines, T3 lines, digital subscriber lines (DSL), Ethernet, Fibre Channel, etc.). Generally, any suitable means of communications may be used such as electric, sound, light, infrared, and/or radio to facilitate communications through one or more networks in accordance with embodiments herein. Communications, interactions, operations, etc. as discussed for various embodiments described herein may be performed among entities that may directly or indirectly connected utilizing any algorithms, communication protocols, interfaces, etc. (proprietary and/or non-proprietary) that allow for the exchange of data and/or information.

In various example implementations, entities for various embodiments described herein can encompass network elements (which can include virtualized network elements, functions, etc.) such as, for example, network appliances, forwarders, routers, servers, switches, gateways, bridges, load balancers, firewalls, processors, modules, radio receivers/transmitters, or any other suitable device, component, element, or object operable to exchange information that facilitates or otherwise helps to facilitate various operations in a network environment as described for various embodiments herein. Note that with the examples provided herein, interaction may be described in terms of one, two, three, or four entities. However, this has been done for purposes of clarity, simplicity and example only. The examples provided should not limit the scope or inhibit the broad teachings of systems, networks, etc. described herein as potentially applied to a myriad of other architectures.

Communications in a network environment can be referred to herein as 'messages', 'messaging', 'signaling', 'data', 'content', 'objects', 'requests', 'queries', 'responses', 'replies', etc. which may be inclusive of packets. As referred to herein and in the claims, the term 'packet' may be used in a generic sense to include packets, frames, segments, datagrams, and/or any other generic units that may be used to transmit communications in a network environment. Generally, a packet is a formatted unit of data that can contain control or routing information (e.g., source and destination address, source and destination port, etc.) and data, which is also sometimes referred to as a 'payload', 'data payload', and variations thereof. In some embodiments, control or routing information, management information, or the like can be included in packet fields, such as within header(s) and/or trailer(s) of packets. Internet Protocol (IP) addresses discussed herein and in the claims can include any IP version 4 (IPv4) and/or IP version 6 (IPv6) addresses.

To the extent that embodiments presented herein relate to the storage of data, the embodiments may employ any number of any conventional or other databases, data stores or storage structures (e.g., files, databases, data structures, data or other repositories, etc.) to store information.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments. Note also that a module, engine, client, controller, function, logic or the like as used herein in this Specification, can be inclusive of an executable file comprising instructions that can be understood and processed on a server, computer, processor, machine, compute node, combinations thereof, or the like and may further include library modules loaded during execution, object files, system files, hardware logic, software logic, or any other executable modules. A "module" may also be a hardware component, including, e.g., fan silencer module 100.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of' can be represented using the '(s)' nomenclature (e.g., one or more element(s)).

In sum, a device is provided. The includes a housing having a first end of the housing, a second end of the housing, and an interior surface between the first end of the housing and the second end of the housing, acoustic absorbing material disposed on the interior surface, a honeycomb air flow director disposed at the second end of the housing, and an electromagnetic interference gasket surrounding an outer edge of the honeycomb air flow director, wherein a depth of the electromagnetic interference gasket is at least as deep as a depth of the honeycomb air flow director.

In an embodiment, the acoustic absorbing material extends, on the interior surface, between the first end of the housing and the second end of the housing.

The device may further include a latch configured to engage with a rack-mounted device. In an embodiment, the first end of the housing extends to a distal end of the latch. Also, the acoustic absorbing material disposed on the interior surface may include a cutout to accommodate the latch.

The device may still further include a handle disposed at the first end of the housing. The first end of the housing may extend to a distal end of the handle. The device may further include an acoustic noise absorber on an exterior surface of the housing.

The housing may be comprised of plastic, and/or of metal.

The device may be fixed to a fan module.

In another embodiment, a device includes a housing having a first end of the housing, a second end of the housing, and an interior surface of the housing between the first end of the housing and the second end of the housing, acoustic absorbing material disposed on the interior surface of the housing, a honeycomb air flow director disposed at the second end of the housing, an electromagnetic interference gasket surrounding an outer edge of the honeycomb air flow director, and a latch a latch configured to engage with a chassis, wherein the acoustic absorbing material disposed on the interior surface includes a cutout to accommodate the latch.

In an implementation, a depth of the electromagnetic interference gasket is at least as deep as a depth of the honeycomb air flow director.

The acoustic absorbing material may extend, on the interior surface of the housing, between the first end of the housing and the second end of the housing.

The first end of the housing may extend to a distal end of the latch.

The device may further include a handle disposed at the first end of the housing. And, the first end of the housing may extend to a distal end of the handle.

In yet another embodiment, a method is provided. The method includes disposing acoustic absorbing material on an interior surface of a housing of a fan silencer module, attaching a honeycomb air flow director to one of the housing of the fan silencer module, and attaching an electromagnetic interference gasket that surrounds an outer edge of the honeycomb air flow director, wherein a depth of the electromagnetic interference gasket is at least as deep as a depth of the honeycomb air flow director.

The method may further include attaching a latch configured to engage with a rack-mounted device, wherein a first end of the housing extends to a distal end of the latch.

The method may also include attaching a handle at a first end of the housing, wherein the first end of the housing extends to a distal end of the handle.

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. A device comprising:
   a housing having a first end of the housing, a second end of the housing, and an interior surface between the first end of the housing and the second end of the housing;
   acoustic absorbing material disposed on the interior surface;
   a honeycomb air flow director disposed at the second end of the housing;
   an electromagnetic interference gasket surrounding an outer edge of the honeycomb air flow director;
   a fan module, wherein at least a portion of the electromagnetic interference gasket is sandwiched between the housing and the fan module; and
   a first latch and a second latch disposed on opposing sides of the housing, wherein a free end of each of the first latch and of the second latch is disposed inside an interior space of the housing,
   wherein the acoustic absorbing material extends from the first end of the housing to the second end of the housing and includes a cutout for each of the first latch and the second latch.

2. The device of claim 1, wherein the acoustic absorbing material extends, on upper and lower interior surfaces of the housing, between the first end of the housing and the second end of the housing.

3. The device of claim 1, wherein the first latch and the second latch are configured to engage with a rack-mounted device.

4. The device of claim 3, wherein the first end of the housing extends to a distal free end of each of the first latch and the second latch.

5. The device of claim 1, further comprising a handle disposed toward the first end of the housing.

6. The device of claim 5, wherein the first end of the housing extends to an end of the handle furthest from the second end of the housing.

7. The device of claim 5, wherein the handle is disposed between the first latch and the second latch.

8. The device of claim 1, wherein the housing is comprised of plastic.

9. The device of claim 1, wherein the housing is comprised of metal.

10. The device of claim 1, wherein a depth of the electromagnetic interference gasket is at least as deep as a depth of the honeycomb air flow director.

11. The device of claim 1, wherein the first end of the housing defines a plane that comprises an end surface of the first end of the housing, and
   wherein the free end of each of the first latch and of the second latch contacts the plane.

12. A device comprising:
   a housing having a first end of the housing, a second end of the housing, and an interior surface of the housing between the first end of the housing and the second end of the housing;
   acoustic absorbing material disposed on the interior surface of the housing;
   a honeycomb air flow director disposed at the second end of the housing;
   an electromagnetic interference gasket surrounding an outer edge of the honeycomb air flow director;
   a fan module, wherein at least a portion of the electromagnetic interference gasket is sandwiched between the housing and the fan module; and
   at least one latch configured to engage with a chassis,
   wherein the acoustic absorbing material disposed on the interior surface of the housing extends from the first end of the housing to the second end of the housing on upper and lower interior surfaces of the housing and includes a cutout to accommodate the at least one latch, and
   wherein a free end of the at least one latch is disposed inside an interior space of the housing.

13. The device of claim 12, wherein a depth of the electromagnetic interference gasket is at least as deep as a depth of the honeycomb air flow director.

14. The device of claim 12, wherein the at least one latch comprises a first latch and a second latch disposed on opposing sides of the housing.

15. The device of claim 12, wherein the first end of the housing extends to a distal free end of the at least one latch.

16. The device of claim 12, further comprising a handle disposed toward the first end of the housing.

17. The device of claim 16, wherein the first end of the housing extends to a side of the handle furthest from the second end of the housing.

18. A method comprising:
 disposing acoustic absorbing material on an interior surface of a housing of a fan silencer module, the housing including a first latch and a second latch disposed on opposing sides of the housing, wherein a free end of each of the first latch and of the second latch is disposed inside an interior space of the housing, and the acoustic absorbing material extending from a first end of the housing to a second end of the housing on upper and lower interior surfaces of the housing and including a cutout for each of the first latch and the second latch;
 attaching a honeycomb air flow director to the housing of the fan silencer module; and
 attaching an electromagnetic interference gasket that surrounds an outer edge of the honeycomb air flow director; and
 sandwiching at least a portion of the electromagnetic interference gasket between the housing and a fan module.

19. The method of claim 18, wherein a first end of the housing extends to a distal free end of each of the first latch and the second latch.

20. The method of claim 18, further comprising attaching a handle to the housing that extends toward the first end of the housing, wherein the first end of the housing extends to a distal end of the handle opposite the second end of the housing.

* * * * *